United States Patent
Regner et al.

[11] Patent Number: 6,094,832
[45] Date of Patent: Aug. 1, 2000

[54] METHOD FOR DEPOSITING SOLDER PASTE ON A PAD

[75] Inventors: Richard Regner, Meridian; Scott Butler, Greenleaf; Carey Blue, Kuna, all of Id.

[73] Assignee: Micron Technology, Inc., Boise, Id.

[21] Appl. No.: 09/270,695

[22] Filed: Mar. 17, 1999

Related U.S. Application Data

[62] Division of application No. 08/986,541, Dec. 8, 1997, Pat. No. 6,012,231.

[51] Int. Cl.⁷ .................................. G01B 5/14; F23J 3/00
[52] U.S. Cl. ...................... 33/562; 228/180.22; 101/127
[58] Field of Search ........................ 33/562; 228/180.22; 101/127

[56] References Cited

U.S. PATENT DOCUMENTS

| | | | |
|---|---|---|---|
| 4,376,505 | 3/1983 | Wojcik | 228/180.22 |
| 4,982,892 | 1/1991 | Parla et al. | 228/180.22 |
| 5,172,853 | 12/1992 | Maiwald | 228/248.1 |
| 5,534,127 | 7/1996 | Sakai | 228/180.22 |
| 5,542,174 | 8/1996 | Chiu | 228/180.22 |
| 5,558,271 | 9/1996 | Rostoker et al. | 228/180.22 |
| 5,643,831 | 7/1997 | Ochiai et al. | 228/180.22 |
| 5,693,559 | 12/1997 | Taniguchi et al. | 228/180.22 |
| 5,718,361 | 2/1998 | Braum et al. | 228/180.22 |
| 5,740,730 | 4/1998 | Thompson | 228/180.22 |

FOREIGN PATENT DOCUMENTS

| | | | |
|---|---|---|---|
| 129374 | 5/1993 | Japan | 228/180.22 |
| 190553 | 7/1993 | Japan | 228/180.22 |

OTHER PUBLICATIONS

Surface Mount International Conference And Exposition, Conventional Center, San Antonio, CA, 8/29/9.

*Primary Examiner*—Diego Gutierrez
*Assistant Examiner*—Maria Fernandez
*Attorney, Agent, or Firm*—Trop, Pruner & Hu, P.C.

[57] ABSTRACT

Solder paste is deposited using a solder stencil with an aperture having a concave edge in order to reduce the formation of solder balls. The solder deposit may be formed on a pad such that the paste has a concave edge. Solder paste deposits may be made on adjacent pads with the concave surfaces facing one another.

7 Claims, 2 Drawing Sheets

METHOD FOR DEPOSITING SOLDER PASTE ON A PAD

This is a divisional of prior application Ser. No. 08/986,541 filed Dec. 8, 1997 now U.S. Pat. No. 6,012,231.

This invention relates generally to a solder stencil for applying a solder paste to a pad in the manufacture of integrated circuits. More particularly, the present invention is directed to reducing the creation of solder balls.

BACKGROUND OF THE INVENTION

Solder stencils are generally utilized in the manufacture of contacts on printed circuit boards to define the shape of a solder paste on the surface to be soldered. Solder paste is a suspension of flux and small spheres of solder particles. When heated, the paste forms a solder which secures two metal pieces together. Solder paste is screen printed onto a circuit board using a stencil. The stencil is a thin sheet of metal that has a desired hole pattern formed in the stencil.

In a reflowing process, the solder melts, forming a mechanical and electrical connection between printed circuit board land pads and an electrical component. Flux encourages the formation of this connection. Flux may be removed through a cleaning process or left on the board with the so-called no clean process.

One problem which may occur with solder paste is the formation of solder balls. Solder balls are small spherical solder particles which are formed away from the main solder pool during reflow. If these balls become loose at any time after the product is manufactured, they can roll to a position where they can short an electrical component. Solder balling may occur around components and over the board. Large solder balls may be associated with small and low clearance passive components such as 0805 and 1206 resistor and capacitor connection sites. The large solder balls may not be removed in the cleaning process and will persist with the no-clean process.

In addition, excessive solder balling may prevent the solder from making a good solder joint fillet. Thus, the formation of solder balls may create reliability issues. There has been a continuous effort to minimize the occurrence of solder balling. See C.A. Harper, Electronic Packaging & Interconnection Handbook, 2d Edition, McGraw Hill (1997), at p. 5.54.

It would be highly desirable to have a technique for forming soldered connections using solder paste which reduces the occurrence of solder balling.

SUMMARY OF THE INVENTION

In accordance with one aspect of the present invention, a solder stencil includes a body having at least one solder aperture. The aperture has a concave edge profile.

In accordance with another aspect of the present invention, a solder stencil for depositing solder paste on a pad includes a plate having at least one solder aperture. The aperture has an area less than the area of the pad.

In accordance with still another aspect of the present invention, a method of depositing solder paste includes the step of forming a deposit of solder paste on the pad. The deposit has an area of less than the area of the pad.

In accordance with another aspect of the present invention, a pad for forming a soldered contact includes a pad and a layer of solder paste on the pad. The solder paste has a concave edge profile.

In accordance with yet another aspect of the present invention, a pad for forming a soldered contact includes a pad and a layer of solder paste on the pad. The layer leaves a concave portion of the pad uncovered by solder paste.

In accordance with but another aspect of the present invention, a method of depositing solder paste includes the step of forming a deposit of solder paste with a concave edge. The solder paste is then deposited on the pad.

In accordance with another aspect of the present invention, a method of depositing solder paste includes the step of forming a solder paste deposit. The solder paste is deposited on the pad such that the area of the solder paste is less than the area of the pad.

These aspects of the present invention may be advantageous for a number of reasons including reducing the occurrence of solder balls.

DESCRIPTION OF THE PREFERRED EMBODIMENTS

Figure 1:
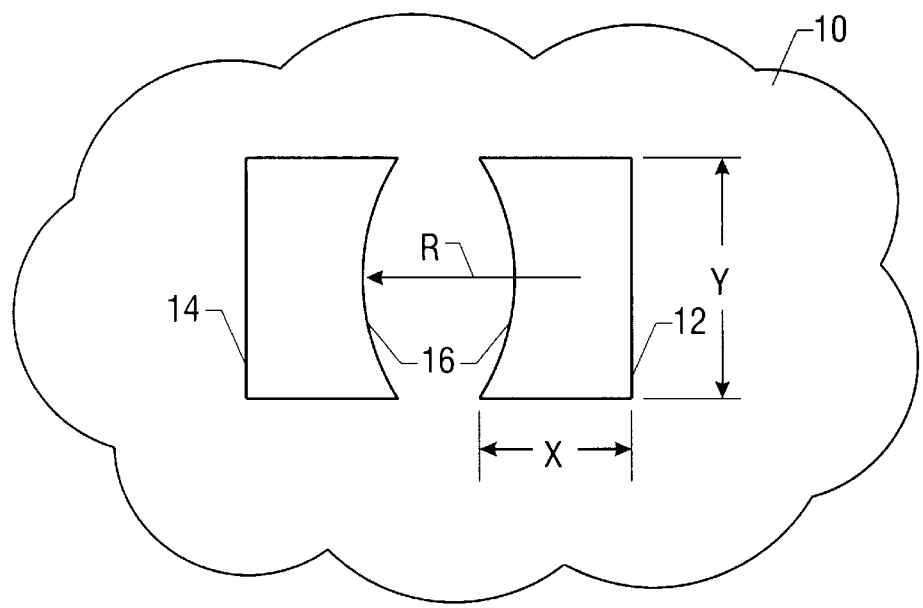
FIG. 1 is a top plan view of a solder stencil having solder apertures.

Referring to the drawing wherein like reference characters are used for like parts throughout the several views, a solder stencil 10 shown in FIG. 1 may be used to apply solder paste to pads on printed circuit boards. The solder stencil 10 is conventionally made of a thin sheet of metal such as brass, stainless steel, molybdenum, alloy-42, or nickel.

The stencil 10 includes a hole pattern represented by the two holes 12 and 14 in FIG. 1. Each of the holes 12 and 14 is of a generally rectangular shape with facing edges 16 having a concave configuration. The holes 12, 14 may be formed by conventional techniques including chemical etching, laser cutting, electropolishing, electroplating and electroforming.

As used herein, "concave" refers to an inwardly directed configuration that would include curved configurations, V-shaped configurations and other like configurations.

Figure 2:
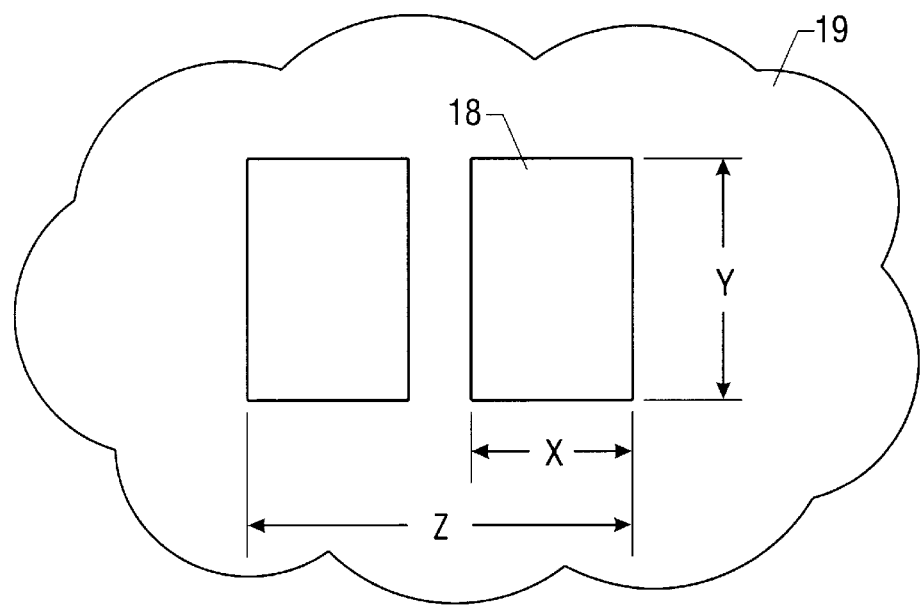
FIG. 2 is a top plan view of a pair of pads on a printed circuit board.

A typical pair of bonding pads 18 of a type used for small passive components such as a capacitor or resistor may be positioned on a printed circuit board 19, as shown in FIG. 2. Each pad 18 has a width "X" and a length "Y". The pads 18 may, for example, be land pads on a conventional printed circuit board. The land pads are generally coated with a deposited layer of solder paste. The solder paste is reflowed to electrically connect a component to the pad 18. The soldering process creates both an electrical and a mechanical connection.

In accordance with one aspect of the present invention, the length Y of the bond pad 18 corresponds generally to the length Y of the solder stencil apertures 12, 14. However, the width X of the bond pad 18 is generally greater than the width of the stencil apertures 12, 14 as indicated in FIG. 2. Generally the width dimensions X of the solder apertures 12, 14 are about 20–30% less than the width X of the corresponding bond pad 18.

The radius of curvature "R" of the concave edge 16 extends from about 0.05 inches to about 0.1 inches and is roughly about twice the length Y of the aperture 12, 14. The distance between the outside edges of the land pads is indicated as "Z". Exemplary approximate dimensions in inches for a 0.006 inch stencil thickness are as follows:

|  |  | X | Y | Z | R |
|---|---|---|---|---|---|
| 0603 | Pad | 0.0175 | 0.035 | 0.075 |  |
|  | Stencil | 0.0140 | 0.035 |  | 0.0591 |
| 0805 | Pad | 0.035 | 0.055 | 0.1 |  |
|  | Stencil | 0.0290 | 0.055 |  | 0.0781 |
| 1206 | Pad | 0.035 | 0.065 | 0.15 |  |
|  | Stencil | 0.0290 | 0.060 |  | 0.092 |

For a 0.008 inch stencil thickness the following are exemplary approximate dimensions for conventional 0603, 0805, 1206 components:

|  |  | X | Y | Z | R |
|---|---|---|---|---|---|
| 0603 | Pad | 0.0175 | 0.035 | 0.075 |  |
|  | Stencil | 0.0125 | 0.035 |  | 0.0590 |
| 0805 | Pad | 0.035 | 0.055 | 0.1 |  |
|  | Stencil | 0.025 | 0.055 |  | 0.092 |
| 1206 | Pad | 0.035 | 0.065 | 0.15 |  |
|  | Stencil | 0.025 | 0.065 |  | 0.092 |

Figure 3:
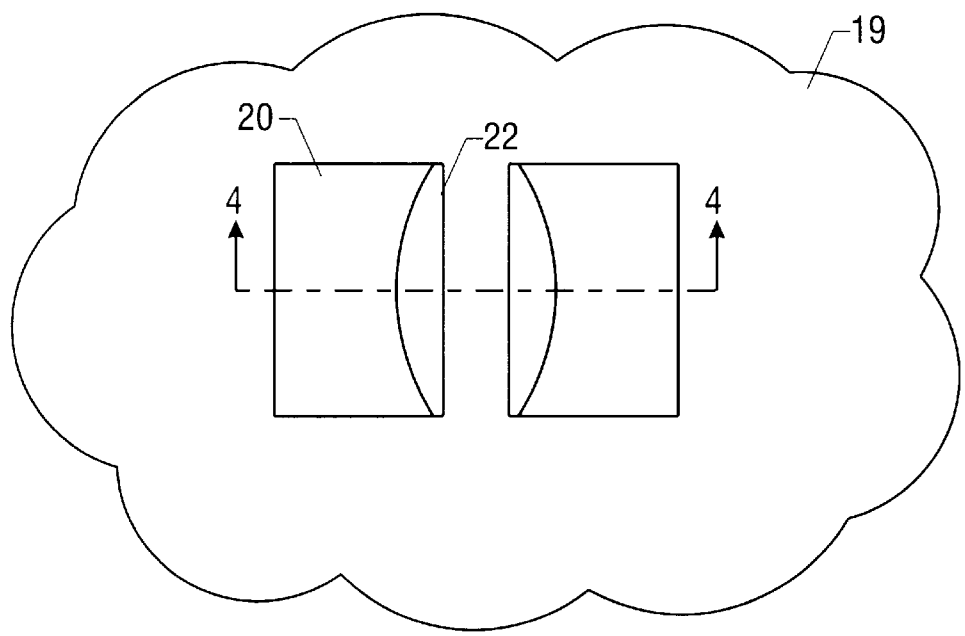
FIG. 3 is a top plan view of solder paste on top of the solder pad shown in FIG. 2.
Figure 4:
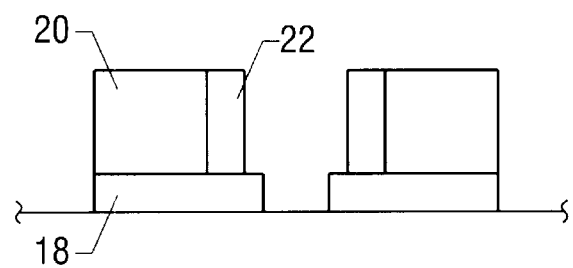
FIG. 4 is a cross-sectional view taken generally along the line 4—4 in FIG. 3.

As shown in FIGS. 3 and 4, the deposited paste 20 does not completely cover the bond pad 18 but, instead, a concave-shaped exposed area 22 remains. As a result of the concave configuration of the deposited paste 20 and the apertures 12 in the stencil 10, the occurrence of solder balls decreases. This is particularly important in situations where no clean fluxes are utilized.

The prevention of solder balling is particularly applicable to forming solder connections with surface mount packaging. The surface mount components are placed onto a printed circuit board and into the deposited paste and then the paste is reflowed. As a result the surface mount components are secured to the pads.

While this invention has been described with respect to a limited number of preferred embodiments, those skilled in the art will appreciate numerous modifications and variations. It is intended that the appended claims cover all such modifications and variations as fall within the true spirit and scope of the present invention.

What is claimed is:

1. A method of depositing solder paste on a pad mounted on a substrate comprising:

providing a system including a solder stencil with an aperture having an exterior concave edge;

positioning said stencil on the pad;

receiving a deposit of solder paste in said stencil;

forming a deposit of solder paste on the pad using said solder stencil;

creating an exterior concave edge on said deposit using said stencil, said deposit having an area less than the area of said pad, the aperture in said stencil being smaller than the area of said pad; and reflowing said solder paste.

2. The method of claim 1 including forming said deposit with an area approximately 70% to 80% of the area of said pad.

3. The method of claim 1 including forming a pair of adjacent deposits of solder paste, each of said deposits having an external concave edge, the external concave edges of said adjacent paste deposits being opposite to one another.

4. The method of claim 1 including reflowing said paste and soldering a surface mount component to said pad.

5. The method of claim 1 including forming said pad of a size selected from the group consisting of 0603, 0805 and 1206 configurations.

6. The method of claim 5 including forming said deposit with a radius of curvature of from about 0.0590 to about 0.092 inches.

7. The method of claim 6 wherein said pads are rectangular and said deposit is formed having a width and length, the length of said deposit being from about 0.0125 to about 0.029 inches.

* * * * *